(12) United States Patent
Lee et al.

(10) Patent No.: US 10,164,207 B2
(45) Date of Patent: Dec. 25, 2018

(54) ORGANIC LIGHT-EMITTING DEVICE AND METHOD FOR MANUFACTURING SAME

(71) Applicant: LG DISPLAY CO., LTD., Seoul (KR)

(72) Inventors: Jung-Hyoung Lee, Daejeon (KR); Jung-Bum Kim, Daejeon (KR)

(73) Assignee: LG DISPLAY CO., LTD., Seoul (KR)

( * ) Notice: Subject to any disclaimer, the term of this patent is extended or adjusted under 35 U.S.C. 154(b) by 488 days.

(21) Appl. No.: 14/790,883

(22) Filed: Jul. 2, 2015

(65) Prior Publication Data

US 2015/0311469 A1 Oct. 29, 2015

Related U.S. Application Data

(62) Division of application No. 13/808,876, filed as application No. PCT/KR2011/005013 on Jul. 8, 2011, now Pat. No. 9,099,671.

(30) Foreign Application Priority Data

Jul. 8, 2010 (KR) ........................ 10-2010-0065710

(51) Int. Cl.
*H01L 51/50* (2006.01)
*H01L 51/52* (2006.01)
*H01L 51/00* (2006.01)

(52) U.S. Cl.
CPC ...... *H01L 51/5212* (2013.01); *H01L 51/0021* (2013.01); *H01L 51/5012* (2013.01); *H01L 51/5228* (2013.01); *H01L 51/5237* (2013.01); *H01L 51/5253* (2013.01); *H01L 2251/5361* (2013.01)

(58) Field of Classification Search
CPC ................................. H01L 51/52; H01L 51/50
USPC .................................... 257/40, 72, 79, 83, 88
See application file for complete search history.

(56) References Cited

U.S. PATENT DOCUMENTS

| 5,701,055 | A | 12/1997 | Nagayama et al. |
|---|---|---|---|
| 6,630,785 | B1 | 10/2003 | Lu |
| 2005/0258436 | A1 | 11/2005 | Arai |
| 2005/0270464 | A1 | 12/2005 | Seo et al. |
| 2006/0055313 | A1* | 3/2006 | Bae ..................... H01L 27/3246 313/500 |

(Continued)

FOREIGN PATENT DOCUMENTS

| CN | 1717137 A | 1/2006 |
|---|---|---|
| JP | 8315981 A | 11/1996 |

(Continued)

*Primary Examiner* — Joseph Galvin, III
(74) *Attorney, Agent, or Firm* — Dentons US LLP

(57) ABSTRACT

An exemplary embodiment of the present invention provides a method for preparing an organic light-emitting device, comprising the steps of: 1) forming a spacer pattern on a first electrode formed on a substrate; 2) forming an organic material layer and a second electrode; 3) exposing the first electrode by forming an encapsulation thin film and then etching at least one portion of the encapsulation thin film; and 4) forming an auxiliary electrode which is electrically connected to the first electrode exposed in the step 3). The organic light-emitting device according to the exemplary embodiment of the present invention may solve problems of a voltage drop due to resistance of a transparent electrode in a longitudinal direction and of resultant brightness non-uniformity of the diode.

13 Claims, 3 Drawing Sheets

(56) References Cited

U.S. PATENT DOCUMENTS

| | | | |
|---|---|---|---|
| 2006/0158095 A1* | 7/2006 | Imamura | H01L 27/3279 |
| | | | 313/500 |
| 2008/0008887 A1 | 1/2008 | Liu et al. | |
| 2008/0012476 A1* | 1/2008 | Kim | H01L 27/3253 |
| | | | 313/504 |
| 2010/0127615 A1* | 5/2010 | Kim | H01L 27/3251 |
| | | | 313/504 |
| 2011/0215362 A1 | 9/2011 | Ono et al. | |

FOREIGN PATENT DOCUMENTS

| | | | |
|---|---|---|---|
| JP | 11204257 A | 7/1999 | |
| JP | 2004-327215 A | 11/2004 | |
| JP | 2005332773 A | 12/2005 | |
| JP | 2007-128726 A | 5/2007 | |
| JP | 2007-234555 A | 9/2007 | |
| JP | 2010-027210 A | 2/2010 | |
| JP | 2010-27210 A | 2/2010 | |
| JP | 2010027210 A | 2/2010 | |
| JP | 2010080310 A | 4/2010 | |
| JP | 2011181405 A | 9/2011 | |
| JP | 2012-503849 | 2/2012 | |
| KR | 10-2002-0090573 A | 12/2002 | |
| WO | 2010034431 | 4/2010 | |

\* cited by examiner

[Figure 1]
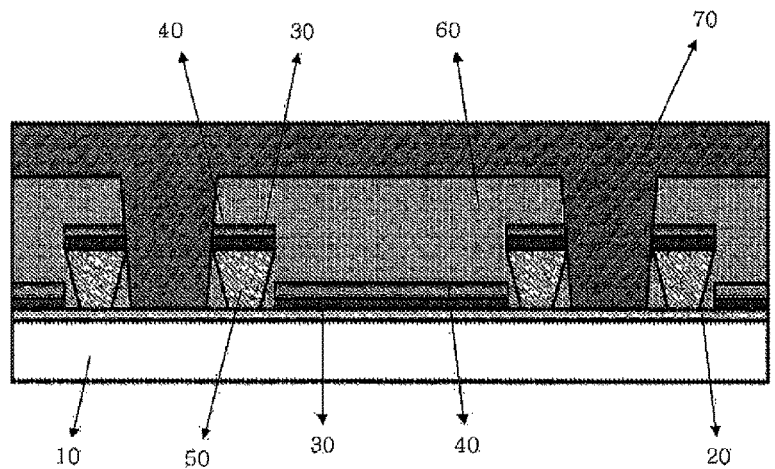
[Figure 2]
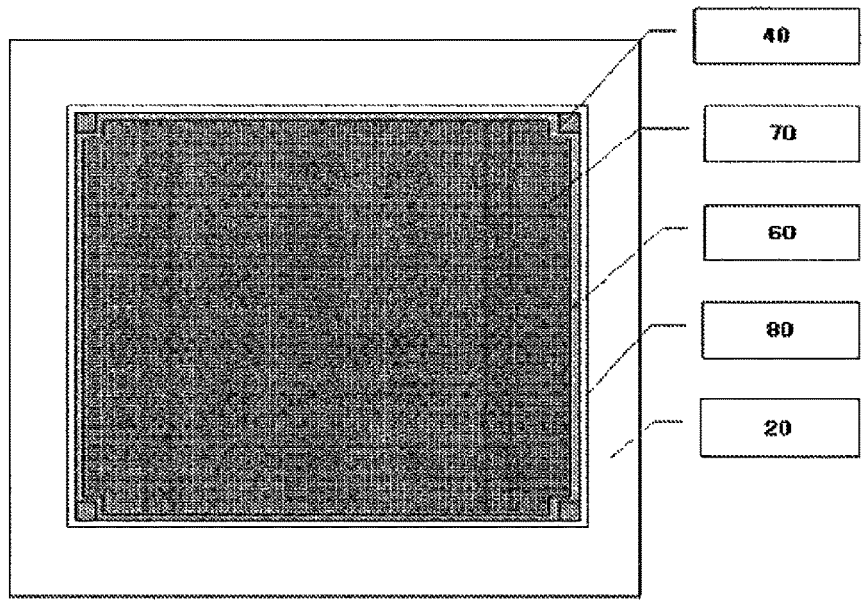

[Figure 3]
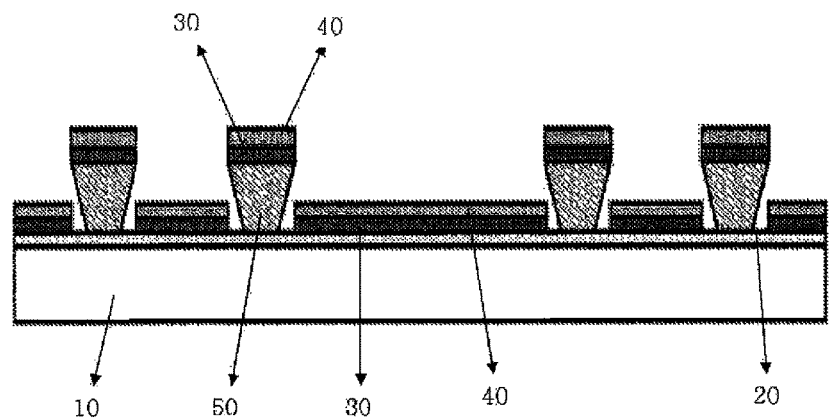
[Figure 4]
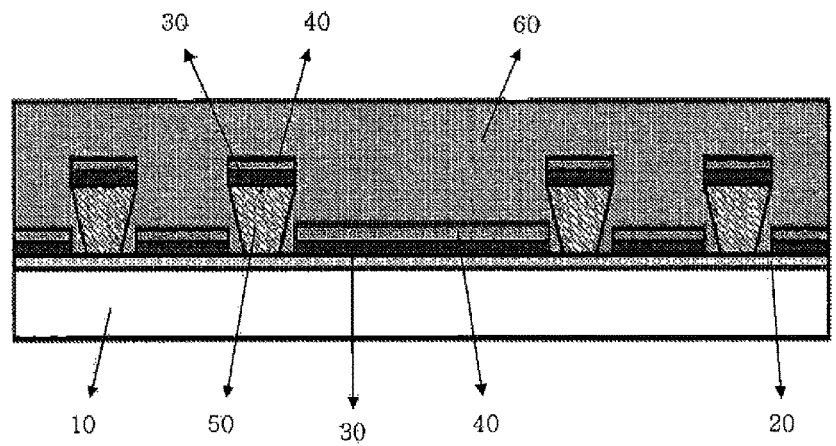

[Figure 5]
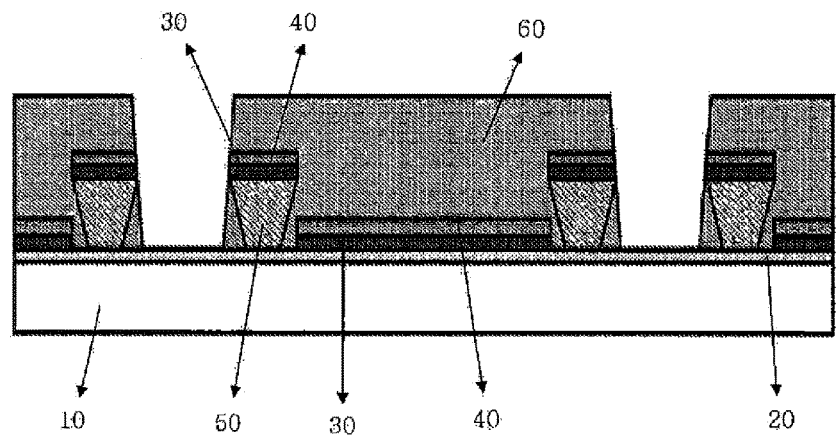
[Figure 6]
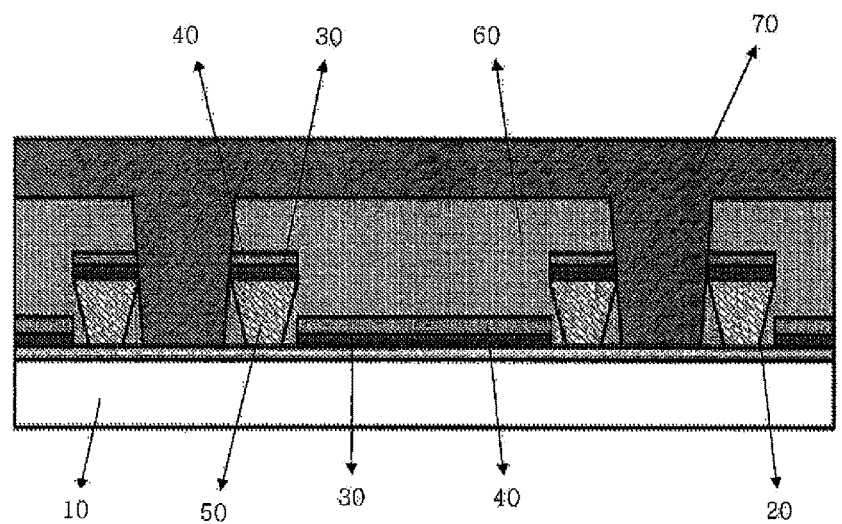

ORGANIC LIGHT-EMITTING DEVICE AND METHOD FOR MANUFACTURING SAME

This application is a divisional of U.S. application Ser. No. 13/808,876, filed on Jan. 7, 2013, which is a national stage application of PCT/KR2011/005013, filed Jul. 8, 2011, which claims priority from Korean Patent Application No. 10-2010-0065710, filed on Jul. 8, 2010, in the Korean Intellectual Property Office, the disclosure of which is incorporated herein by reference in its entirety.

TECHNICAL FIELD

The present invention relates to an excellent organic light-emitting device that can ensure brightness uniformity and stability of the diode by minimizing a voltage drop of a transparent electrode layer, and a method for preparing the same.

BACKGROUND ART

An organic light-emitting device is formed of two opposite electrodes and thin films of organic materials having multilayered semiconductor properties existing therebetween. The organic light-emitting device of the above configuration uses a phenomenon where electric energy is converted into light energy by using an organic material, that is, an organic light emitting phenomenon. In detail, in the structure where an organic material layer is disposed between an anode and a cathode, when a voltage is applied between two electrodes, holes are injected to the organic material layer in the anode and electrons are injected into the organic material layer in the cathode. The injected hole and electron meet each other to form an exciton, and when the exciton is reduced to a ground state, light is emitted.

In the above organic light-emitting device, light that is generated in the organic material layer is emitted through the light transmissive electrode, and the organic light-emitting device may be generally classified into a top emission type, a bottom emission type and a dual emission type. In the case of the top or bottom emission type, one of two electrodes should be a light transmissive electrode, and in the case of the dual emission type, both of the two electrodes should be light transmissive electrodes.

In respect to the organic light-emitting device, many studies have been concentrated since Kodak Co., Ltd. announced that in the case where the multilayer structure is used, the driving at a low voltage is implemented. Recently, a natural color display using the organic light-emitting device is attached to a mobile phone and commercialized.

In addition, a study for the recent organic light-emitting device using a phosphorescent material instead of a known fluorescent material has been progressed, such that efficiency is rapidly improved, and it is expected that the diode would be able to replace a known lighting in the near future.

In order to use the organic light-emitting device for lighting, unlike the known natural color display, the diode should be driven at high brightness, and constant brightness should be maintained like the known lighting. In order to sufficiently improve brightness of the organic light-emitting device, light emission should be implemented in a large area, and in order to implement light emission in the large area, a high driving current should be used. In addition, in order to maintain the constant brightness in the large area, the high current should be uniformly injected into the diode having the large area.

In general, as an anode material of the organic light-emitting device, metal oxide having a large work function is mainly used. However, the electroconductivity of the metal oxide is not relatively high. Accordingly, in the case where the metal oxide is used in an organic EL or an LCD having a small display area, there is no problem, but in the case where the metal oxide is used in an organic EL with a large area which is used for a lighting device, a voltage drop due to a high current is large, such that the current is not uniformly injected into a light emission surface, and therefore light emission of the diode is not uniformly implemented. For example, light emission occurs only around a portion of the electrode that is electrically connected to a driving circuit and weak light emission or no light emission may occur in the remaining region.

Meanwhile, as a cathode material of the organic light-emitting device, a metal having a small work function or an alloy thereof is mainly used. The metal itself may have high electroconductivity, but in the case where transparency of the electrode is required because of characteristics of the organic light-emitting device, if the electrode is formed of a thin film, the electroconductivity is decreased. Accordingly, even in the above case, since the current is not uniformly injected into the light emission surface, light emission of the diode may not be uniformly implemented.

Therefore, in order to use the organic light-emitting device as the lighting device, the light emission of high brightness needs to uniformly occur in the diode having the large area by decreasing resistance of the electrode.

In addition, the decreasing of the resistance of the electrode may also be usefully used in manufacturing of a passive matrix display diode as well as the organic light-emitting device having the large area. Since the passive matrix display does not require an amorphous or polysilicon thin film transistor back plate, unlike an active matrix, a manufacturing cost is very low. However, recently, since the passive matrix organic EL display has various problems, an active matrix organic EL display rather than the passive matrix organic EL display is rising as a candidate for commercialization. One of the major problems of the passive matrix organic EL display is that the manufacturing of an electrode having excellent light transmittance and electroconductivity in manufacturing of the passive matrix organic EL display diode is an essential technology, but if resistance of the recently used electrode is large and the size of the display is increased by this, a voltage drop in the electrode becomes serious, such that it is difficult to implement a display image.

Accordingly, in an organic light-emitting device field, development of a technology for decreasing resistance of the electrode is required.

DISCLOSURE

Technical Problem

The present invention has been made in an effort to provide an organic light-emitting device that ensures brightness uniformity and stability of the diode by minimizing a voltage drop of a transparent electrode layer, and has an auxiliary electrode that can be formed by a simple process, and a method for preparing the same.

Technical Solution

An exemplary embodiment of the present invention provides a method for preparing an organic light-emitting device, comprising the steps of: 1) forming a spacer pattern on a first electrode formed on a substrate; 2) forming an organic material layer and a second electrode; 3) exposing the first electrode after forming an encapsulation thin film and etching at least one portion of the encapsulation thin film; and 4) forming an auxiliary electrode which is electrically connected to the first electrode exposed in the step 3).

Another exemplary embodiment of the present invention provides an organic light-emitting device prepared by the method.

Yet another exemplary embodiment of the present invention provides an organic light-emitting device, comprising a substrate, a first electrode, an organic material layer, and a second electrode, the organic light-emitting device comprising: a spacer pattern formed on the first electrode, an auxiliary electrode electrically connected to the first electrode; and an encapsulation thin film between the second electrode and the auxiliary electrode, Advantageous Effects According to the exemplary embodiments of the present invention, the organic light-emitting device may solve problems of a drop voltage due to a resistance of a transparent electrode in a longitudinal direction, and resultant brightness non-uniformity of the diode. In addition, in the organic light-emitting device according to the exemplary embodiments of the present invention, since an auxiliary electrode is formed on a first electrode, it is possible to form a more excellent transparent electrode.

BRIEF DESCRIPTION OF DRAWINGS

FIG. 1 is a view that illustrates an organic light-emitting device according to an exemplary embodiment of the present invention.

FIG. 2 is a view that illustrates an organic light-emitting device according to an exemplary embodiment of the present invention.

FIGS. 3 to 6 are views that illustrate a method for preparing an organic light-emitting device according to an exemplary embodiment of the present invention.

BEST MODE

Hereinafter, the present invention will be described in detail.

In general, an organic light-emitting device has a structure in which two electrodes having a large area face each other and an organic material layer that emits light by a current is formed therebetween. The current is applied at an edge of one electrode, flows toward the center of the electrode, passes through an organic material, and is discharged to the other electrode facing the electrode. In this case, a voltage drop occurs in proportion to a resistance of the electrode while the current flows to the center of the electrode from the edge thereof. Since energy is consumed as much as the voltage drop occurs due to the resistance of the electrode, energy efficiency of the organic light-emitting device is decreased.

In addition, since an electric field formed between two electrodes varies, a light emitting amount of the organic material varies depending on a position of the electrode, and a difference in brightness depending on the position is not good in terms of an appearance and negatively affects stability of the diode. Accordingly, in the organic light-emitting device, a design for minimizing these problems is needed.

The organic light-emitting device has a structure in which two transparent electrodes or a transparent electrode and a metal electrode face each other. The voltage drop in the electrode becomes problematic in the transparent electrode that has a relatively high surface resistance. As the transparent electrode, ITO (indium tin oxide) and the like are used, and the surface resistance value of the transparent electrode comprising the ITO is 10 to 30 $\Omega/\square$, which is different from 0.3 $\Omega/\square$ that is the surface resistance value of the metal electrode manufactured by depositing Al of 100 nm by about 100 times. In order to decrease the surface resistance value of the transparent electrode, a method for forming a metal auxiliary electrode on a transparent electrode is generally used. In order to uniformly decrease the surface resistance value without decreasing an opening ratio of a light emission region surface, a fine metal electrode should be formed. To this end, a photolithography method is used.

However, there is a disadvantage in that this process requires a high process cost. In addition, a metal electrode layer is also deposited together with the organic material layer on the metal auxiliary electrode. In this case, because of a possible short circuit between the metal auxiliary electrode and the metal electrode on the transparent electrode, there is a problem in that when the metal auxiliary electrode is formed, an insulation layer needs to be additionally formed thereon.

Accordingly, an exemplary embodiment of the present invention provides an organic light-emitting device that can ensure brightness uniformity and stability of the diode by minimizing a voltage drop of a transparent electrode layer even without forming a very fine auxiliary electrode.

A method for preparing an organic light-emitting device according to another exemplary embodiment of the present invention comprises the steps of: 1) forming a spacer pattern on a first electrode formed on a substrate, 2) forming an organic material layer and a second electrode, 3) exposing the first electrode after forming an encapsulation thin film and etching at least one portion of the encapsulation thin film; and 4) forming an auxiliary electrode which is electrically connected to the first electrode exposed in the exposing of the first electrode, In the method for preparing the organic light-emitting device according to the exemplary embodiment of the present invention, the step 1) comprises forming the spacer pattern on the first electrode formed on the substrate.

For the substrate in the step 1), a substrate that is known in the art may be used without limitation, and in more detail, there may be a glass substrate and a plastic substrate, but the present invention is not limited thereto.

The first electrode in the step 1) may be formed by depositing metal or metal oxide having the conductivity or an alloy thereof on the substrate by using a physical vapor deposition (PVD) method such as sputtering or e-beam evaporation.

In particular, it is preferable that the first electrode in the step 1) comprises a transparent conductive material such as indium tin oxide (ITO), indium zinc oxide (IZO), zinc oxide (ZnO), and tin oxide ($SnO_2$), but it is not limited thereto.

The step 1) may further comprise forming an insulation layer pattern on the substrate. The insulation layer pattern serves to divide pixels in an organic light-emitting device having a large area and may be formed by using a material and a method that are known in the art.

The spacer pattern in the step 1) may be formed by using a material and a method that are known in the art. The spacer pattern may function as a barrier rib or a support in the organic light-emitting device. After the spacer pattern is formed, a portion thereof is etched to thereby form a contact hole for forming the auxiliary electrode electrically connected to the first electrode.

In the method for preparing the organic light-emitting device according to the exemplary embodiment of the present invention, the step 2) comprises forming the organic material layer and the second electrode.

In the step 2), the organic material layer and the second electrode may be formed on the entire upper region of the first electrode and the spacer formed in the step 1).

Specific materials and formation methods of the organic material layer and the second electrode formed in the second step may use materials and formation methods that are known in the art without limitation.

The second electrode may be a metal electrode, More specifically, the second electrode may comprise at least one of Al, Ca, Mg, Ag, and the like, but is not limited thereto.

In the organic light-emitting device according to the exemplary embodiment of the present invention, the organic material layer may be manufactured in the smaller number of layers with various polymer materials by using not a deposition method but a solvent process, for example, spin coating, dip coating, doctor blading, screen printing, inkjet printing, a heat transferring method and the like.

The organic material layer according to the exemplary embodiment of the present invention may be a laminate structure that comprises a light emitting layer, and one or more selected from a hole injection layer, a hole transport layer, an electron transport layer, and an electron injection layer.

In the organic light-emitting device according to the exemplary embodiment of the present invention, as a material that can form the hole injection layer, in general, it is preferable to use a material having a large work function so that hole injection to the organic material layer is smooth. As detailed examples of the hole injection material that may be used in the present invention, there are metal such as vanadium, chrome, copper, zinc, and gold or an alloy thereof; metal oxide such as zinc oxide, indium oxide, indium tin oxide (ITO), and indium zinc oxide (IZO); a combination of metal and oxide such as $ZnO:Al$ or $SnO_2:Sb$; and a conductive polymer such as poly(3-methylthiophene), poly[3,4-(ethylene-1,2-dioxy)thiophene] (PEDT), polypyrrole, and polyaniline, but it is not limited thereto.

In the organic light-emitting device according to the exemplary embodiment of the present invention, as a material that can form the electron injection layer, in general, it is preferable to use a material having a small work function so that electron injection to the organic material layer is easily performed. As detailed examples of the electron injection material, there are metal such as magnesium, calcium, sodium, potassium, titanium, indium, yttrium, lithium, gadolinium, aluminum, silver, tin, and lead or an alloy thereof; a multilayered structure material such as LiF/Al or $LiO_2$/Al, and the same material as the hole injection electrode material may be used, but it is not limited thereto.

In the organic light-emitting device according to the exemplary embodiment of the present invention, as the material that may form the light emitting layer, it is preferable to use a material that can emit light of visible ray region by receiving holes and electrons from the hole transport layer and the electron transport layer, respectively and combining the holes and the electrons and has high quantum efficiency in respect to fluorescent or phosphorescent light. As detailed examples thereof, there are a 8-hydroxy-quinoline aluminum complex ($Alq_3$); a carbazole-based compound; a dimerized styryl compound; BAlq; a 10-hydroxybenzoquinoline-metal compound; benzoxazole, benzthiazole, and benzimidazole-based compound; a poly (p-phenylenevinylene) (PPV)-based polymer; a spiro compound; polyfluorene, rubrene; and phosphorescent host CBP [[4,4-bis(9-carbazolyl)biphenyl], but it is not limited thereto.

In addition, the light emitting material may further comprise a phosphorescent dopant or a fluorescent dopant in order to improve fluorescent or phosphorescent characteristics. As detailed examples of the phosphorescent dopant, there are ir(ppy)3(fac tris(2-phenylpyridine) iridium) or F2Irpic[hidium(III)bis[4,6-di-fluorophenyl-pyridinato-N, C2) picolinate], As the fluorescent dopant, materials known in the art may be used.

In the organic light-emitting device according to the exemplary embodiment of the present invention, as the material that can form the electron transport layer, it is preferable to use a material that can receive electrons well from the electron injection layer and transport the electrons to the light emitting layer and has a large mobility in respect to the electron. As detailed examples thereof, there are an 8-hydroxyquinoline Al complex; a complex comprising $Alq_3$; an organic radical compound; a hydroxyflavone-metal complex and the like, but it is not limited thereto.

In the method for preparing the organic light-emitting device according to the exemplary embodiment of the present invention, the step 3) comprises exposing the first electrode after forming the encapsulation thin film and etching at least one portion of the encapsulation thin film. That is, in the step 3), a thin film encapsulates the entire region and then is etched to thereby form a contact hole contacting with the first electrode.

In the step 3), the etching of the thin film may use laser etching and the like, but is not limited thereto.

In the method for preparing the organic light-emitting device according to the exemplary embodiment of the present invention, the step 4) comprises forming the auxiliary electrode which is electrically connected to the first electrode exposed in the third step.

The auxiliary electrode for decreasing resistance of the first electrode may be formed by depositing one or more selected from the group consisting of conductive sealant and metal. More specifically, the auxiliary electrode may comprise Cr, Mo, Al, Cu, and an alloy thereof, but is not limited thereto.

That is, in the step 4), the auxiliary electrode electrically connected to the first electrode may be formed by depositing the conductive sealant or the metal on the encapsulation thin film and the contact hole.

In addition, in the method for preparing the organic light-emitting device according to the exemplary embodiment of the present invention, the first electrode may be the transparent electrode and the second electrode may be the metal electrode, but are not limited thereto.

Hereinafter, an organic light-emitting device according to the exemplary embodiment of the present invention will be described in detail with reference to the accompanying drawings. However, the following drawings are to illustrate various exemplary embodiments and characteristics of the present invention, but are not to be construed to limit the scope of the present invention.

FIGS. 1 and 2 are views that illustrate an organic light-emitting device according to an exemplary embodiment of the present invention.

Further, FIGS. 3 to 6 are views that illustrate a method for preparing an organic light-emitting device according to the exemplary embodiment of the present invention.

As shown in FIGS. 3 to 6, the method for preparing the organic light-emitting device according to the exemplary embodiment of the present invention, comprises the steps of: 1) forming a spacer pattern 50 on a first electrode 20 formed on a substrate 10; 2) forming an organic material layer 30 and a second electrode 40; 3) exposing the first electrode 20 by forming an encapsulation thin film 60 and then etching at least one portion of the encapsulation thin film 60; and 4) forming an auxiliary electrode 70 which is electrically connected to the first electrode 20 exposed in the exposing of the first electrode 20.

Further, the present invention provides an organic light-emitting device prepared by the method for preparing organic light-emitting device.

The organic light-emitting device according to the exemplary embodiment of the present invention may be more preferably applied to an organic light-emitting device for lighting.

Further, the present invention provides an organic light-emitting device comprising a substrate, a first electrode, an organic material layer, and a second electrode, the organic light-emitting device comprising: a spacer pattern formed on the first electrode, an auxiliary electrode electrically connected to the first electrode; and an encapsulation thin film between the second electrode and the auxiliary electrode.

In particular, in an organic light-emitting device in the related art, since the first electrode which is the transparent electrode has low conductivity, a voltage drop occurs due to electrode resistance in a longitudinal direction from a first electrode pad terminal to the center of the diode at the time of implementing the diode having a large area, which causes brightness non-uniformity of the diode.

However, the organic light-emitting device according to the exemplary embodiment of the present invention may prevent the voltage drop due to the electrode resistance by forming the auxiliary electrode by the specific method, thereby preventing the brightness non-uniformity of the diode.

The invention claimed is:

1. An organic light-emitting device comprising:
    a substrate,
    a first electrode on the substrate,
    an organic material layer on the first electrode,
    a second electrode on the organic material layer,
    a spacer pattern on the first electrode,
    an encapsulation thin film on the second electrode and the spacer pattern, and
    an auxiliary electrode on the encapsulation thin film and directly connected to the first electrode.

2. The organic light-emitting device according to claim 1, wherein the first electrode comprises one or more selected from the group consisting of metal, metal oxide, and an alloy thereof.

3. The organic light-emitting device according to claim 1, wherein the auxiliary electrode comprises one or more selected from the group consisting of conductive sealant and metal.

4. The organic light-emitting device according to claim 1, wherein the organic light-emitting device is an organic light-emitting device for lighting.

5. The organic light-emitting device according to claim 1, wherein the organic material layer is further provided on the spacer pattern.

6. The organic light-emitting device according to claim 5, wherein the organic material layer on the spacer pattern is spaced apart from the organic material layer on the first electrode.

7. The organic light-emitting device according to claim 5, wherein the organic material layer on the spacer pattern contacts the auxiliary electrode.

8. The organic light-emitting device according to claim 5, wherein the second electrode is further provided over the spacer pattern.

9. The organic light-emitting device according to claim 8, wherein the organic material layer on the spacer pattern is between the spacer pattern and the second electrode over the spacer pattern.

10. The organic light-emitting device according to claim 8, wherein the second electrode over the spacer pattern is spaced apart from the second electrode on the organic material layer.

11. The organic light-emitting device according to claim 8, wherein the second electrode over the spacer pattern contacts the auxiliary electrode.

12. The organic light-emitting device according to claim 8, wherein the encapsulation thin film is on the second electrode over the spacer pattern.

13. The organic light-emitting device according to claim 8, wherein the auxiliary electrode is over the second electrode over the spacer pattern.

* * * * *